United States Patent
Chung (10) Patent No.: US 8,343,803 B2
(45) Date of Patent: Jan. 1, 2013

(54) LIGHTWEIGHT AND COMPACT THROUGH-SILICON VIA STACK PACKAGE WITH EXCELLENT ELECTRICAL CONNECTIONS AND METHOD FOR MANUFACTURING THE SAME

(75) Inventor: Qwan Ho Chung, Gyeonggi-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 64 days.

(21) Appl. No.: 12/913,020

(22) Filed: Oct. 27, 2010

(65) Prior Publication Data

US 2011/0045636 A1 Feb. 24, 2011

Related U.S. Application Data

(62) Division of application No. 11/869,052, filed on Oct. 9, 2007, now Pat. No. 7,847,379.

(30) Foreign Application Priority Data

Jun. 26, 2007 (KR) ........................ 10-2007-0063173

(51) Int. Cl.
*H01L 21/00* (2006.01)

(52) U.S. Cl. ........ 438/106; 438/109; 438/121; 438/254; 257/678; 257/686; 257/E21.575

(58) Field of Classification Search ................... 438/109, 438/254, 106, 121; 257/621–686
See application file for complete search history.

(56) References Cited

U.S. PATENT DOCUMENTS

| 6,809,421 B1 | 10/2004 | Hayasaka et al. | |
| 7,741,152 B2 * | 6/2010 | Huang et al. | 438/109 |
| 2003/0127720 A1 * | 7/2003 | Fang | 257/686 |
| 2007/0105304 A1 * | 5/2007 | Kasai et al. | 438/254 |
| 2007/0181991 A1 | 8/2007 | Ishino et al. | |
| 2008/0079121 A1 * | 4/2008 | Han | 257/621 |
| 2008/0083975 A1 | 4/2008 | Chao et al. | |

FOREIGN PATENT DOCUMENTS

KR 1020010060208 A 7/2001

OTHER PUBLICATIONS

USPTO OA mailed Jul. 22, 2009 for U.S. Appl. No. 11/869,052.
USPTO OA mailed Nov. 23, 2009 for U.S. Appl. No. 11/869,052.
USPTO OA mailed Jun. 7, 2010 for U.S. Appl. No. 11/869,052.
USPTO NOA mailed Jul. 29, 2010 for U.S. Appl. No. 11/869,052.

* cited by examiner

*Primary Examiner* — Jerome Jackson, Jr.
*Assistant Examiner* — Fang-Xing Jiang
(74) *Attorney, Agent, or Firm* — Ladas & Parry LLP

(57) ABSTRACT

A through-silicon via stack package contains package units. Each package unit includes a semiconductor chip; a through-silicon via formed in the semiconductor chip; a first metal line formed on an upper surface and contacting a portion of a top surface of the through-silicon via; and a second metal line formed on a lower surface of the semiconductor chip and contacting a second portion of a lower surface of the through-silicon via. When package units are stacked, the second metal line formed on the lower surface of the top package unit and the first metal line formed on the upper surface of the bottom package unit are brought into contact with the upper surface of the through-silicon via of the bottom package unit and the lower surface of the through-silicon via of the top package unit, respectively. The stack package is lightweight and compact, and can form excellent electrical connections.

8 Claims, 6 Drawing Sheets

LIGHTWEIGHT AND COMPACT THROUGH-SILICON VIA STACK PACKAGE WITH EXCELLENT ELECTRICAL CONNECTIONS AND METHOD FOR MANUFACTURING THE SAME

CROSS-REFERENCE TO RELATED APPLICATIONS

The present application claims priority to Korean patent application number 10-2007-0063173 filed on Jun. 26, 2007, which is incorporated herein by reference in its entirety.

BACKGROUND OF THE INVENTION

The present invention relates to a stack package, and more particularly, to a through-silicon via stack package that is lightweight and compact and that forms excellent electrical connections, and a method for manufacturing the same.

Previous developments in packaging technology for semiconductor integrated circuits have been driven by the demands of miniaturization and high capacity. In the prior art various techniques for stack packages that provide satisfactory results in terms of miniaturization, high capacity, and mounting efficiency have been developed.

The term "stack", as referred to in the semiconductor industry, means to vertically pile at least two chips or packages. In memory devices by stacking chips or packages it is possible to realize a product having a memory capacity that is greater than what is obtainable through semiconductor integration processes, and also by stacking the chips or packages mounting area utilization efficiency can be improved.

Stack package manufacturing methods can be divided into a first method in which individual semiconductor chips are stacked and the stacked semiconductor chips are packaged, and a second method in which individually packaged semiconductor chips are stacked upon one another. In a typical stack package, electrical connections are formed by metal wires or through-silicon vias.

Figure 1:
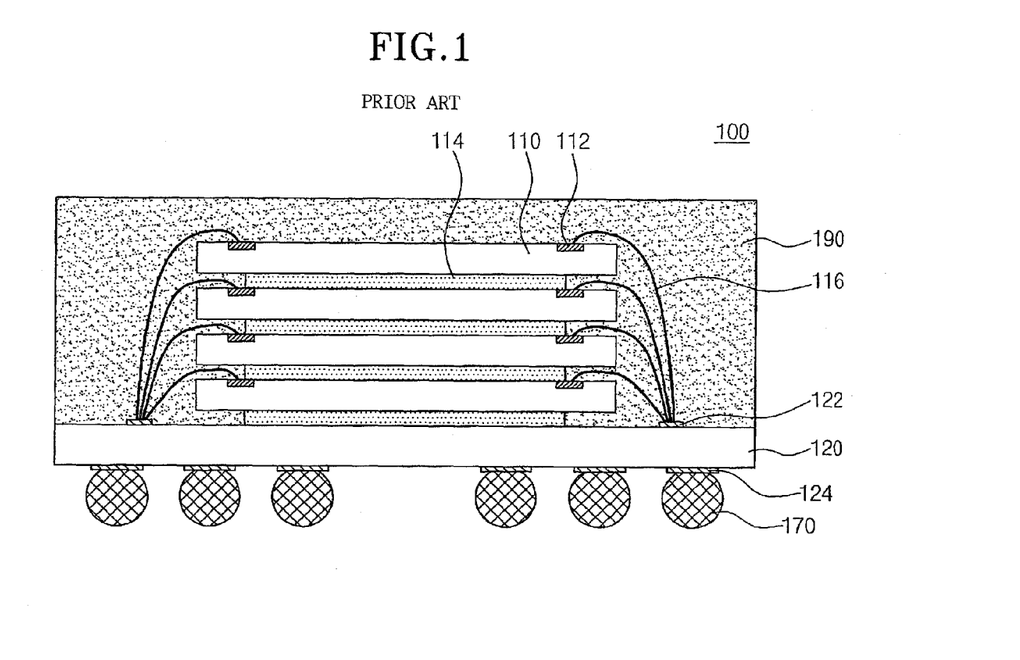
FIG. 1 is cross-sectional view illustrating a conventional stack package that uses metal wires.

FIG. 1 is cross-sectional view illustrating a conventional stack package using metal wires.

Referring to FIG. 1, in the conventional stack package 100 using metal wires, at least two semiconductor chips 110 are stacked on a substrate 120 by the medium of adhesive 114, and the respective chips 110 and the substrate 120 are electrically connected to each other by metal wires 116.

In FIG. 1, the unexplained reference numeral 112 designates bonding pads, 122 connection pads, 124 ball lands, 170 outside connection terminals, and 190 an encapsulant.

However, in the conventional stack package 100 using metal wires, electrical signal exchange is conducted through the metal wires 116, which causes a slow operation speed in each semiconductor chip 110. Also, the metal wires 116 cause the electrical characteristics of each chip 110 to be degraded. Further, an additional area for accommodating the metal wires 116 is needed in the substrate 120, thus increasing the size of the stack package 100, and a gap is needed to bond the metal wires 116 to the respective chips 110, thus increasing the overall height of the stack package 100.

In order to overcome the problems caused in by a stack package using metal wires, (i.e. prevent the electrical characteristics of the stack package from being degraded, and enable the stack package to be miniaturized), a stack package using through-silicon vias (TSVs) has been suggested in the art.

Figure 2:
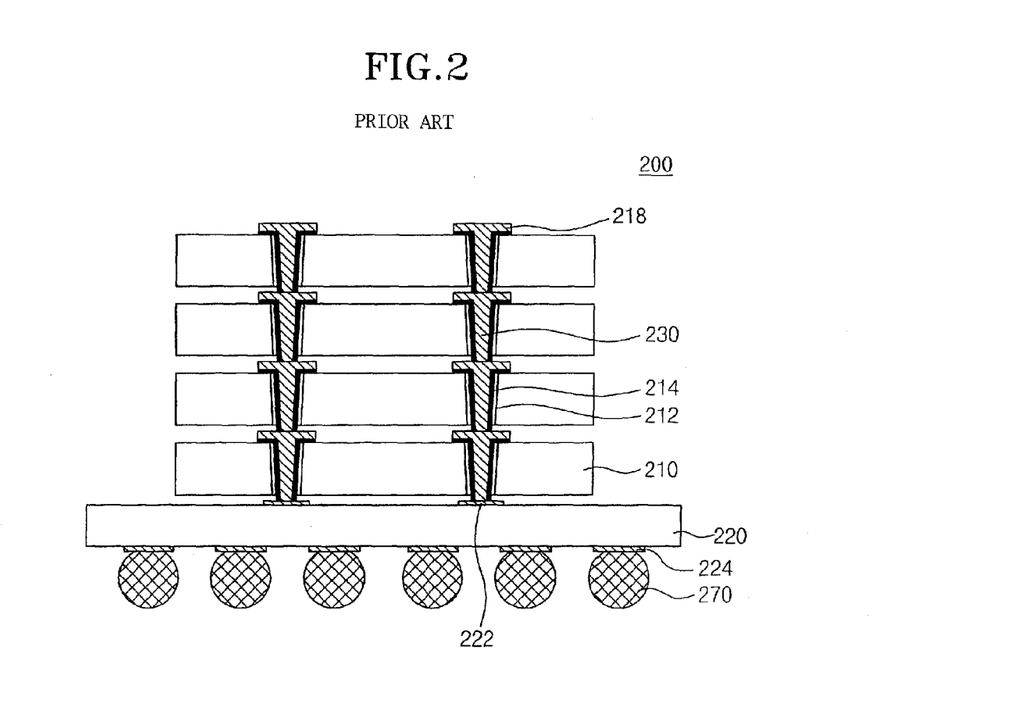
FIG. 2 is cross-sectional view illustrating a conventional stack package that uses through-silicon vias.

FIG. 2 is cross-sectional view illustrating another conventional stack package using through-silicon vias.

Referring to FIG. 2, in a conventional stack package 200 using through-silicon vias, semiconductor chips 210 having through-silicon vias 230 formed therein are stacked on a substrate 220 in a manner such that the through-silicon vias 230 of the chips 210 face each other.

In FIG. 2, the unexplained reference numeral 212 designates an insulation layer, 214 a metal seed layer, 222 connection pads, 224 ball lands, 270 outside connection terminals, and 218 metal lines.

In the stack package 200 using through-silicon vias, by forming the electrical connections using through-silicon vias 230, it is possible to prevent the electrical characteristics of each chip 210 from being degraded. Therefore, the operation speed of the semiconductor chip 210 can be increased, and the semiconductor chip 210 can be miniaturized.

However, in the conventional stack package 200 using through-silicon vias, because of the small surface area of the portions of the through-silicon vias 230 which project out of the semiconductor chips, when electrically connecting the stacked semiconductor chips 210 to one another it is difficult to precisely align the through-silicon vias 230. Moreover, the projecting portion of the through-silicon vias 230 and the metal lines 218 which the projecting portion is connected to cause the thickness of the stack package 200 to increase.

SUMMARY OF THE INVENTION

Embodiments of the present invention are directed to a through-silicon via stack package that is lightweight and compact and that can form excellent electrical connections, and a method for manufacturing the same.

In one aspect, a through-silicon via stack package has at least two package units stacked upon each other, each package unit comprising: a semiconductor chip; at least one through-silicon via formed in the semiconductor chip; a first metal line formed on an upper surface of the semiconductor chip to be brought into contact with a first portion of a top surface of the through-silicon via; and a second metal line formed on a lower surface of the semiconductor chip to be brought into contact with a second portion of a bottom surface of the through-silicon via, wherein a top package unit and a bottom package unit can be stacked in a manner such that the second metal line formed on the lower surface of the top package unit and the first metal line formed on the upper surface of the bottom package unit are respectively brought into contact with the second portion of the top surface of the through-silicon via of the bottom package unit and the first portion of the bottom surface of the through-silicon via of the bottom package unit.

The through-silicon via and the first and second metal lines are formed of one selected from the group consisting of copper (Cu), aluminum (Al), tin (Sn), nickel (Ni), aurum (Au), and alloys thereof.

The first metal line and the through-silicon via may be formed integrally with each other.

The first metal line formed on the upper surface of the bottom package unit is engaged with the second metal line formed on the lower surface of the top package unit.

The first and second metal lines may have the shapes of semicircles, which have bases facing each other.

The first and second metal lines are formed to have the same thickness.

The second metal line formed on the lower surface of the bottom package unit and the first metal line formed on the upper surface of the top package unit are physically and electrically connected to the top surface of the through-silicon via of the bottom package unit and the bottom surface of the through-silicon via of the top package unit, respectively, by the medium of solder.

A filler material may be filled between the stacked package units.

A capping layer may be formed on the upper surface of the top package unit.

In another aspect, a method for manufacturing a through-silicon via stack package comprises the steps of defining at least one groove in a semiconductor chip; filling a metal layer in the groove and forming a first metal line to be brought into contact with a first portion of an upper surface of the metal layer; removing a lower portion of the semiconductor chip to expose a lower end of the metal layer thereby forming a through-silicon via; forming a second metal line on a lower surface of the resultant semiconductor chip to be brought into contact with the second portion of a lower surface of the through-silicon via, thereby forming a package unit; and stacking at least two package units formed in this way, wherein the package units are stacked in a manner such that the second metal line of a top package unit and the first metal line of a bottom package unit are brought into contact respectively with the top surface of the through-silicon via of the bottom package unit and the bottom surface of the through-silicon via of the top package unit.

The step of forming the metal layer and the first metal line comprises the steps of forming an insulation layer on a sidewall of the groove; forming a first metal seed layer on the semiconductor chip, the insulation layer, and the bottom of the groove; forming a metal layer on the first metal seed layer to fill the groove; and patterning the metal layer and the first metal layer.

The step of forming the second metal line comprises the steps of forming a second metal seed layer on a lower surface of the semiconductor chip including the through-silicon via; forming a metal layer on the second metal seed layer; and patterning the metal layer and the second metal seed layer.

The through-silicon via and the first and second metal lines are formed of one selected from the group consisting of copper (Cu), aluminum (Al), tin (Sn), nickel (Ni), aurum (Au), and alloys thereof.

The first metal line formed on the upper surface of the bottom package unit is engaged with the second metal line formed on the lower surface of the top package unit.

The first and second metal lines may be formed to have the shapes of semicircles which have bases facing each other.

The first and second metal lines are formed to have the same thickness.

The second metal line formed on the lower surface of the top package unit and the first metal line formed on the upper surface of the bottom package unit are physically and electrically connected to the upper surface of the through-silicon via of the bottom package unit and the lower surface of the through-silicon via of the top package unit, respectively, by the medium of solder.

After the step of stacking the package units, the method further comprises the step of filling a filler material between the stacked package units, excluding the area occupied by the first and second metal lines.

After the step of stacking the package units, the method further comprises the step of forming a capping layer on the upper surface of the top package unit.

The step of defining the groove through the step of forming the package unit may also be implemented at the wafer level.

DESCRIPTION OF SPECIFIC EMBODIMENTS

In the present invention, by forming through-silicon vias to have a small projecting height, it is possible to solve the problems of conventional stacked packages, which include: misalignment and increased height of a package resulting when a plurality of semiconductor chips are stacked.

In the present invention, in order to form a stack package, through-silicon vias are formed in each semiconductor chip. When the metal lines, which contact the upper and lower surfaces of the through silicon vias, are formed, one metal line is positioned on one half of the upper surface of each through-silicon via and another metal line positioned on the other half of the lower surface of each through-silicon via, with the metal line on the upper surface and the metal line on the lower surface facing opposite directions. Then at least two semiconductor chips having the structure just described above are stacked in a manner such that the metal line formed on one half of the upper surface of the through-silicon via of the bottom semiconductor chip is engaged with the metal line formed on the other half of the lower surface of the through-silicon via of the top semiconductor chip, whereby a through-silicon via stack package is formed.

Accordingly, in the present invention, the stack package can be precisely formed while preventing the misalignment of the respective semiconductor chips stacked upon one another. Also, the height of the contact area for forming an electrical connection between two semiconductor chips is decreased, thus decreasing the thickness of the entire stack package. Further, in the present invention the contact area between two semiconductor chips is small, and an electrical connection is formed through surface contact in the horizontal direction between the two metal lines instead of substantial point contact in the vertical direction between the projecting portion of one through-silicon via and the metal line of the other through-silicon via, and therefore excellent electrical connections can be formed, thus increasing the manufacturing yield.

Hereafter, a through-silicon via stack package in accordance with an embodiment of the present invention will be described in detail.

Figure 3:
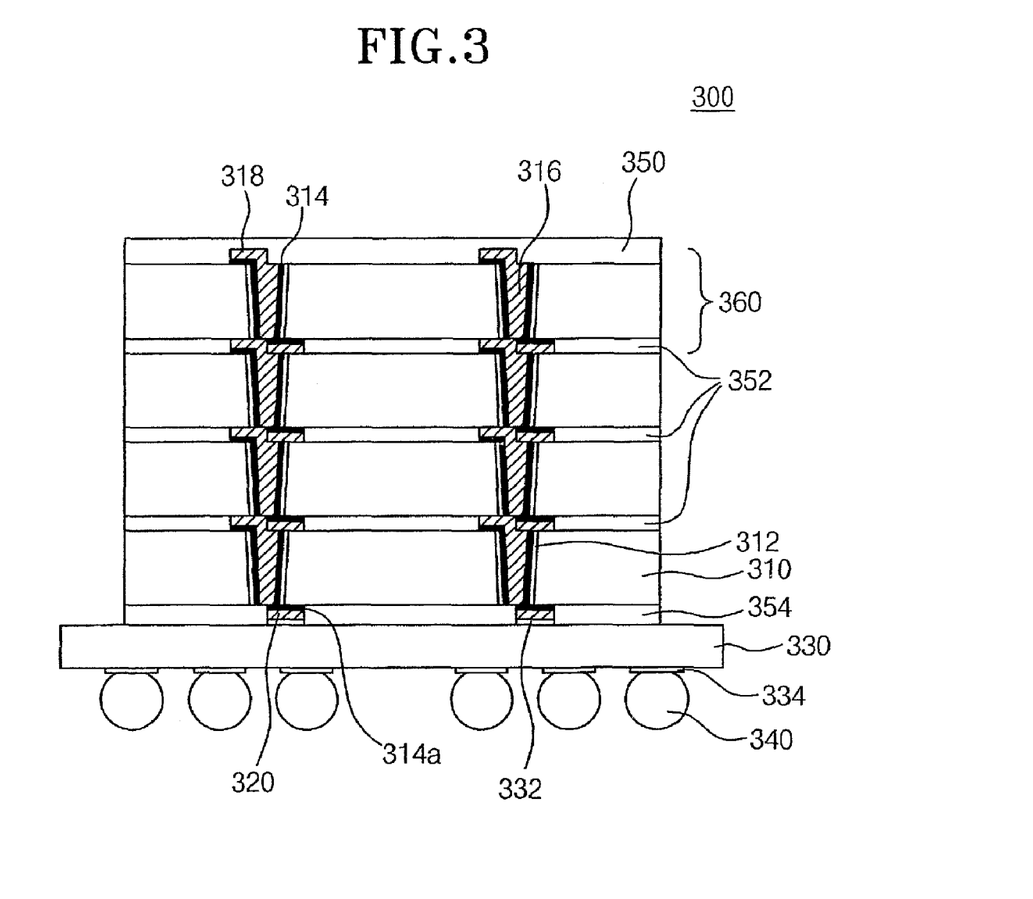
FIG. 3 is a cross-sectional view illustrating a through-silicon via stack package in accordance with an embodiment of the present invention.

FIG. 3 is a cross-sectional view illustrating a through-silicon via stack package in accordance with an embodiment of the present invention.

Referring to FIG. 3, in the through-silicon via stack package 300, at least two package units 360, each of which has through-silicon vias 316 and metal lines 318 and 320, are stacked on a substrate 330.

In each package unit 360, at least one through-silicon via 316 is formed in each semiconductor chip 310. The first metal line 318 is formed on the upper surface of the semiconductor chip 310 in such a way as to be brought into contact with one half of an upper surface of the through-silicon via 316, and the second metal line 320 is formed on the lower surface of the semiconductor chip 310 in such a way as to be brought into contact with the other half of the lower surface of the through-silicon via 316.

The first and second metal lines 318 and 320 can be formed into various shapes. Preferably, the first and second metal lines 318 and 320 are formed in the shapes of semicircular pads that face opposite directions such that the bases of the semicircular pads face each other. In order to appropriately form the stack package, the first and second metal lines 318 and 320 are formed to have the same height.

The package units 360 are stacked upon one another in a manner such that the second metal line 320 formed on the lower surface of the upper package unit 360 comes into contact with the upper surface of the through silicon via 316 of the lower package unit 360, and the first metal line 318 formed on the upper surface of the lower package unit 360 is brought into contact lower surface of the through silicon via 316 of the upper package unit 360. A medium of solder (not shown) may thereafter be formed between the first and second metal lines 318 and 320 and the through silicon vias 316. To further clarify, the first and second metal lines 318 and 320 are formed in the respective package units 360 in a manner such that they do not overlap each other in the vertical direction. In other words, when forming the stack package, the first and second metal lines 318 and 320 are formed on the upper and lower surfaces of each through-silicon via in the respective package unit 360 in a manner such that they define the shape of a complete circle when looked at from the top of the package unit.

In each package unit 360, the through-silicon via 316 and the first metal line 318 are integrally formed with each other using a plating process. Metal seed layers 314 and 314a are placed under the through-silicon via 316 and the first and second metal lines 318 and 320. An insulation layer 312 is placed under the sidewall of the metal seed layer 314 placed under the through-silicon via 316.

The first and second metal lines 318 and 320 and the metal seed layers 314 and 314a are formed of copper (Cu), aluminum (Al), tin (Sn), nickel (Ni), aurum (Au), or an alloy thereof.

In order to electrically connect the stacked package units 360 to the outside, the stacked package units 360 are mounted to a substrate 330. The substrate 330 is provided with a plurality of connection pads 332 on the upper surface thereof and is provided with a plurality of ball lands 334 on the lower surface thereof. The ball lands 334 have outside connection terminals 340 attached thereto. The second metal lines 320 of the lowermost stacked package unit 360 are electrically connected to the connection pads 332 of the substrate 330 by a medium of solder.

In order to protect the stacked package units 360 from external circumstances, a first filler material 352 is formed between the stacked package units 360, and a second filler material 354 is formed between the lowermost stacked package unit 360 and the substrate 330. A capping layer 350 is formed on the uppermost stacked package unit 360. The first and second filler materials 352 and 354 are formed of non-conductive paste or non-conductive film, which also serves to physically attach the stacked package units 360 to one another and the lowermost stacked package unit 360 to the substrate 330.

Although not shown in the drawings, it can be envisaged that first and second metal lines can be formed on one package unit to face the same first direction The first and second metal lines are the formed other package such that they face the same second, but in a direction which is opposite to the first direction. A through-silicon via stack package can then be formed by stacking the package units each of which has first and second metal lines formed to face the same direction.

As described above, in the present invention, the through-silicon via stack package is formed by stacking the respective package units such that the metal lines thereof are brought into surface contact with each other in the horizontal direction, and thus it is possible to precisely form a stack package without causing misalignment between the package units. Also, since the height of a contact area for forming an electrical connection is decreased, the thickness of the entire stack package can also be decreased.

Also, in the present invention, the contact area between two semiconductor chips is small, and an electrical connection is formed through surface contact in the horizontal direction between the two metal lines rather than substantial point contact in the vertical direction between the projecting portion of one through-silicon via and the metal line of the other through-silicon via, and therefore excellent electrical connections can be formed leading to an increase in manufacturing yield.

FIGS. 4A through 4G are cross-sectional views illustrating the processes of a method for manufacturing a through-silicon via stack package in accordance with another embodiment of the present invention.

Figure 4A:
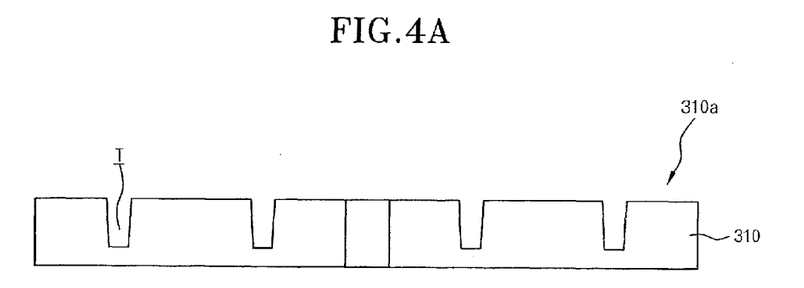
FIGS. 4A through 4G are cross-sectional views illustrating the processes of a method for manufacturing a through-silicon via stack package in accordance with another embodiment of the present invention.

Referring to FIG. 4A, a plurality of grooves T are defined in a wafer 310a which has completely undergone a manufacturing process and has a plurality of semiconductor chips 310. The grooves T are formed to a depth such that the grooves T not to pass through the wafer 310a.

Figure 4B:
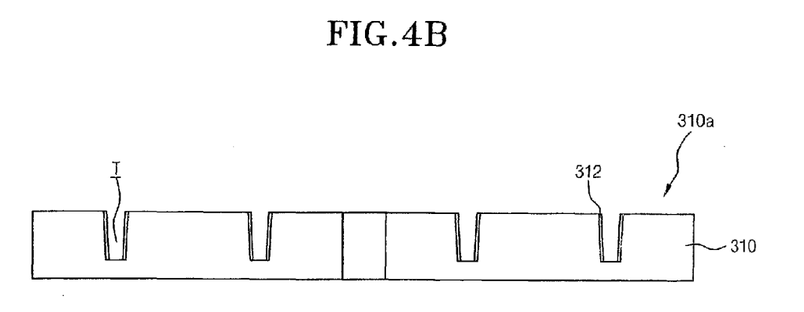

Referring to FIG. 4B, an insulation layer 312 is formed on the upper surface of the wafer 310a and the surfaces of the grooves T. An etch-back process is then conducted such that the insulation layer 312 remains only on the sidewalls of the grooves T.

Figure 4C:
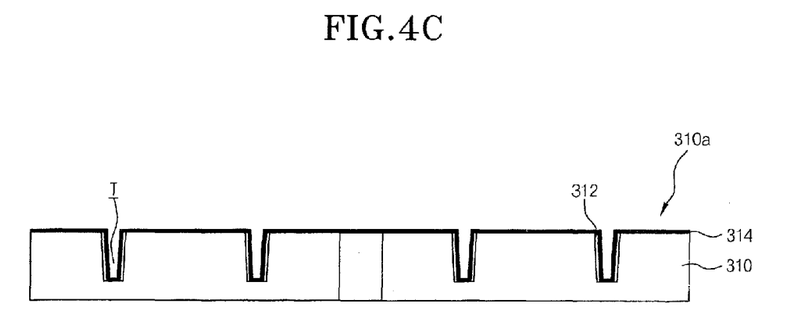

Referring to FIG. 4C, a first metal seed layer 314 is formed on the wafer 310a, the insulation layer on the sidewalls of the grooves T, and the bottom of each groove. The first metal seed layer 314 is formed of copper (Cu), aluminum (Al), tin (Sn), nickel (Ni), aurum (Au), or an alloy thereof, using a conventional technique.

Figure 4D:
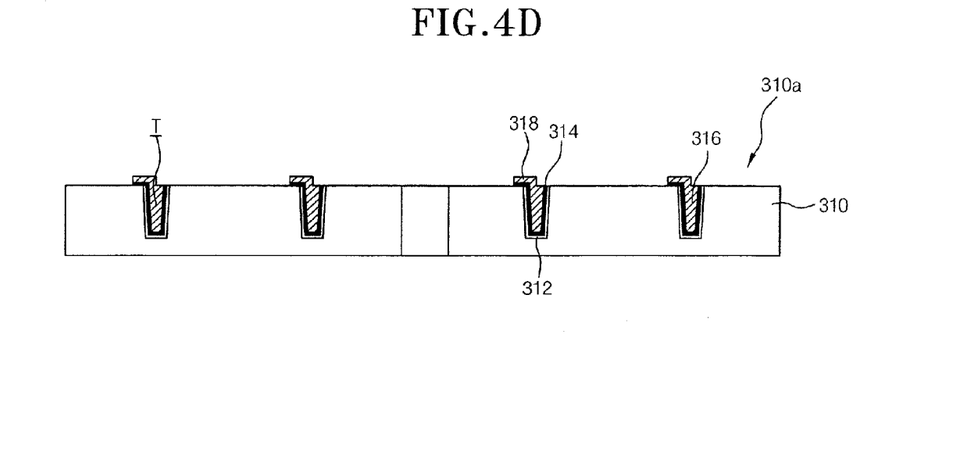

Referring to FIG. 4D, by conducting a plating process on the wafer 310a, which is formed with the first metal seed layer 314, a metal layer is formed to fill the grooves T. The metal layer and first metal seed layer 314 are partially removing using a patterning process, so that through-silicon vias 316 are formed in each semiconductor chip 310, and first metal lines 318 are formed into the shape of a semicircle. Each first metal line 318 is connected to one portion of the upper surface of the through-silicon via 316. The first metal line 318 is formed of copper (Cu), aluminum (Al), tin (Sn), nickel (Ni), aurum (Au), or an alloy thereof.

Before patterning the metal layer, an etch-back process may be conducted on the metal layer on the wafer so that the height of the metal layer is decreased to a thickness appropriate for forming the desired stack package. Thereafter, by conducting the patterning process, the first metal lines 318 can be formed.

Figure 4E:
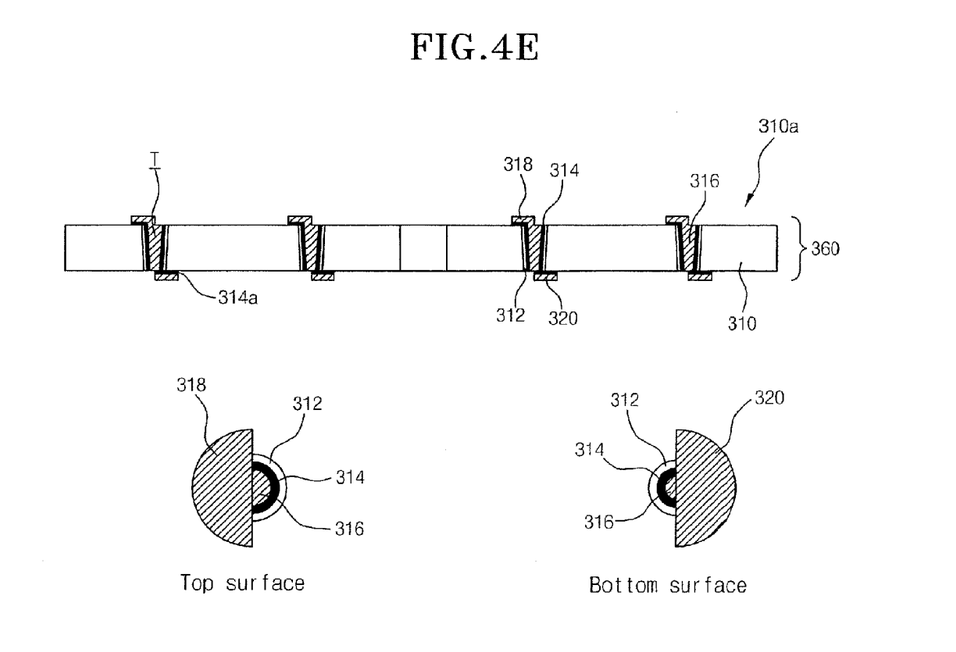

Referring to FIG. 4E, a grinding process is conducted on the lower surface of the wafer 310a in a manner such that the lower surface of the through-silicon via 316 is exposed through the lower surface of the wafer 310a. The grinding is performed such that the exposed lower surface of the through-silicon via 316 is flush with the lower surface of the wafer 310a. A second metal seed layer 314a is formed on the entire lower surface of the wafer 310a. A plating process is then conducted, and a metal layer is formed on the second metal seed layer 314a. A patterning process is then conducting forming second metal lines 320 that are each connected to the other portion of the lower surface of the through-silicon via 316, thus completing a plurality of package units 360.

The second metal line 320 is formed in the shape of a semicircle facing the opposite direction of the first metal line 318, such that the bases of the semicircles of the first and second metal lines 318 and 320 are lined up with each other. The second metal seed layer 314a and the second metal line 320 are formed of copper (Cu), aluminum (Al), tin (Sn), nickel (Ni), aurum (Au), or an alloy thereof.

Figure 4F:
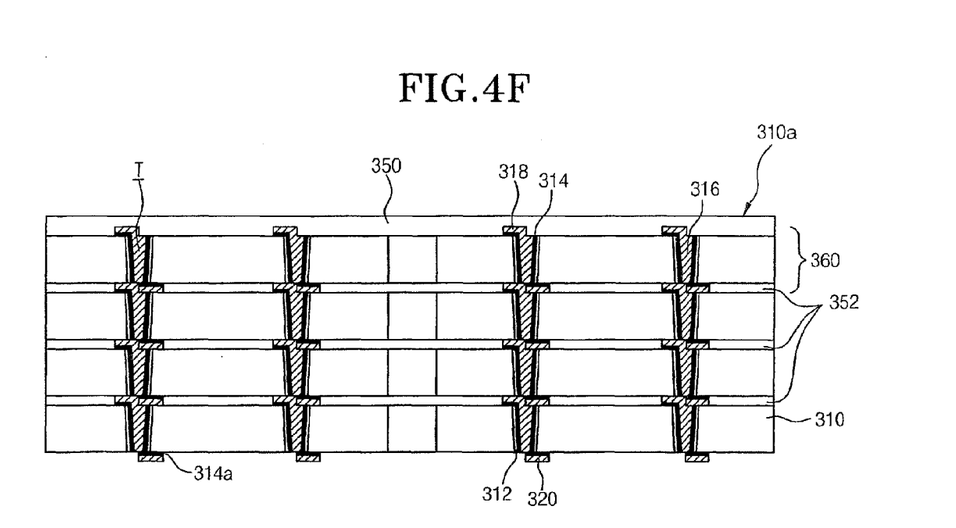

Referring to FIG. 4F, at least two wafers 310a that have undergone the above processes are stacked upon each other. The wafers 310a are stacked in a manner such that the second metal line 320 formed on the lower surface of the upper package unit 360 is attached to the through-silicon via 316 of the lower package unit 360, and the first metal line 318 formed on the upper surface of the lower package unit 360 is attached to the through-silicon via 316 of the upper package unit 360. The first and second metal lines 318 and 320 and the through-silicon vias 316 of the respective package units 360 are electrically connected to each other by a medium of solder (not shown).

A first filler material 352, which comprises non-conductive paste (NCP) or non-conductive film, is filled between the wafers 310a, excluding the areas occupied by the first and second metal lines 318 and 320. A capping layer 350 for providing electrical insulation is then formed on the uppermost stacked package unit 360.

Figure 4G:
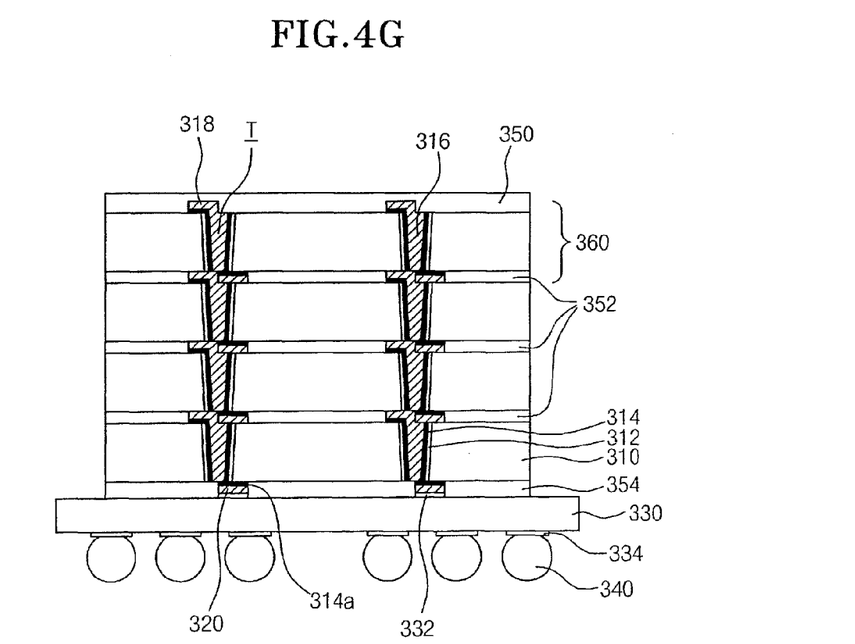

Referring to FIG. 4G, the stacked package units 360 are divided into a chip level to form through-silicon via stack packages. The stacked package units 360 of the chip level are then mounted to a substrate 330 that has connection pads 332 on the upper surface thereof and ball lands 334 on the lower surface thereof. In the stacked package units 360, the second metal lines 320 of the lowermost stacked package unit 360 are attached to the connection pads 332 of the substrate 330 using a medium of solder (not shown). In order to improve the reliability of joints, a second filler material 354, which comprises non-conductive paste (NCP) or non-conductive film, is filled between the lowermost stacked package unit 360 and the substrate 330. Solder balls 340 are attached to the ball lands 334 of the substrate 330.

Figure 5:
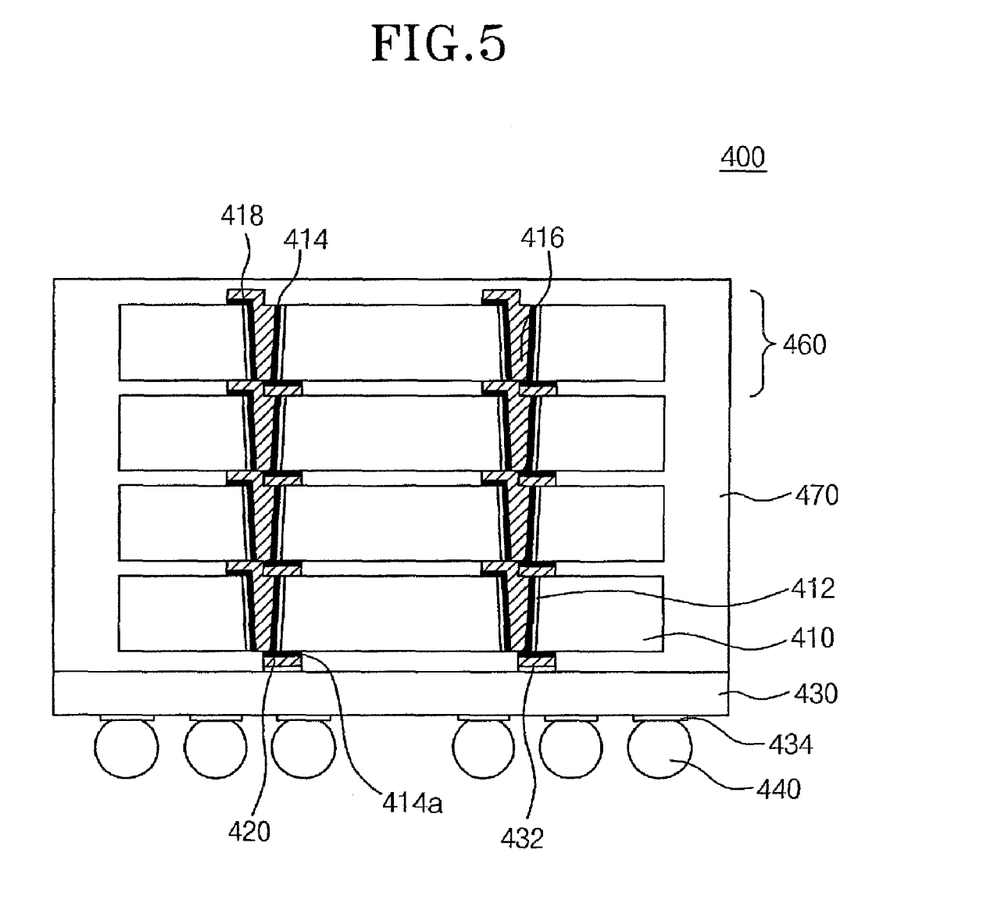
FIG. 5 is a cross-sectional view illustrating a through-silicon via stack package in accordance with still another embodiment of the present invention.

FIG. 5 is a cross-sectional view illustrating a through-silicon via stack package in accordance with still another embodiment of the present invention.

Referring to FIG. 5, in the through-silicon via stack package 400, while the package units 460 are stacked in the same manner as shown in FIG. 3, instead of using the first filler material 352, the second filler material 354, and the capping layer 350, an encapsulant 470 is formed to cover the upper surface of the substrate 430 including the space between stacked package units 460, the space between the lowermost stacked package unit 460 and the substrate 430, and the upper surface of the uppermost stacked package unit 460.

In the stack package according to the present embodiment, the package units 460 are stacked in the same manner as shown in FIGS. 4a through 4e. Then, after attaching the stacked package units 460 to the substrate 430, in order to provide electrical insulation and improve the reliability of joints, the encapsulant 470 is formed to cover the upper surface of the substrate 430 including the space between the stacked package units 460, the space between the lowermost stacked package unit 460 and the substrate 430, and the upper surface of the uppermost stacked package unit 460.

Although not shown in the drawings, in the present invention, a stack package can also be configured in a manner such that, while package units are stacked to have the same structure as the stack package shown in FIG. 3 or 5, a substrate is not used to form electrical connections with the outside. Instead, re-routing lines are formed on the lower surface of the lowermost stacked semiconductor chip and outside connection terminals are attached to the re-routing lines.

As is apparent from the above description, in the present invention, by forming the through-silicon via stack package in a manner such that metal lines are brought into surface contact with each other in the horizontal direction, it is possible to precisely form the stack package without causing misalignment between stacked package units. Also, because the height of the contact area for forming an electrical connection is decreased, the thickness of the entire stack package can also be decreased.

Additionally, as described above the contact area between two semiconductor chips is small, and an electrical connection is formed through surface contact in the horizontal direction between the two metal lines rather than being formed through substantial point contact in the vertical direction between the projecting portion of one through-silicon via and the metal line of the other through-silicon via, and therefore excellent electrical connections can be formed, thus leading to increased manufacturing yield.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a through-silicon via stack package comprising the steps of:
   providing a plurality of package units, the method of manufacturing each package unit comprising the steps of:
      defining at least one groove on an upper surface of a semiconductor chip;
      forming a metal layer in each groove and a first metal line on at least the upper surface of the semiconductor chip such that the first metal line is in contact with a portion of the metal layer filling the groove;
      removing a lower portion of the semiconductor chip from the lower surface thereof to expose the lower end of the groove filled with the metal layer to form a through-silicon via; and
      forming a second metal line on the lower surface of the semiconductor chip such that the second metal line contacts a portion of the metal layer of the through-silicon via exposed through the bottom surface of the semiconductor chip; and
   stacking a plurality of package units,
   wherein the top package unit among any two stacked package units is referred to as "the upper stacked package unit" and wherein the lower package unit among any two stacked package units is referred to as "the lower stacked package unit," and
   wherein the package units are stacked such that the second metal line of the upper stacked package unit electrically connects the metal layer of the through-silicon via of the lower stacked package unit, and such that the first metal line of a lower stacked package unit electrically connects metal layer of the through-silicon via of the upper stacked package unit
   wherein each of the first and second metal lines is semicircular in shape such that the first and second metal lines form a fitted circular shape.

2. The method according to claim 1, wherein the metal layer in the through-silicon via and the first and second metal lines include one of copper (Cu), aluminum (Al), tin (Sn), nickel (Ni), aurum (Au), and alloys thereof.

3. The method according to claim 1, wherein the first metal line formed on the upper surface of the lower stacked package unit is engaged with the second metal line formed on the lower surface of the upper stacked package unit.

4. The method according to claim 1, wherein the first and second metal lines are formed to a same thickness.

5. The method according to claim 1,
wherein the second metal line formed on the lower surface of the upper stacked package unit is physically and electrically connected to the metal layer of the through-silicon via of the lower stacked package unit using solder, and
wherein the first metal line formed on the upper surface of the lower stacked package unit is physically and electrically connected to the metal layer of the through-silicon via of the upper stacked package unit using solder.

6. The method according to claim 1, further comprising:
after the step of stacking the package units, filling a filler material between the stacked package units, excluding the area occupied by the first and second metal lines.

7. The method according to claim 1, further comprising:
after the step of stacking the package units, forming a capping layer on an upper surface of the uppermost stacked package unit.

8. The method according to claim 1, wherein the step of defining the groove through the step of forming the package unit are implemented at a wafer level.

* * * * *